(12) United States Patent
Mehta et al.

(10) Patent No.: US 8,435,379 B2
(45) Date of Patent: May 7, 2013

(54) SUBSTRATE CLEANING CHAMBER AND CLEANING AND CONDITIONING METHODS

(75) Inventors: Vineet Mehta, Mountain View, CA (US); Karl Brown, Mountain View, CA (US); John A. Pipitone, Livermore, CA (US); Daniel J. Hoffman, Saratoga, CA (US); Steven C. Shannon, San Mateo, CA (US); Keith A. Miller, Sunnyvale, CA (US); Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1354 days.

(21) Appl. No.: 11/745,451

(22) Filed: May 8, 2007

(65) Prior Publication Data

US 2008/0276958 A1 Nov. 13, 2008

(51) Int. Cl.
  *H01L 21/306* (2006.01)
(52) U.S. Cl.
  USPC ............... 156/345.43; 156/345.47
(58) Field of Classification Search ............ 156/345.45, 156/345.46, 345.47, 345.43, 345.44; 118/723 E
  See application file for complete search history.

(56) References Cited

U.S. PATENT DOCUMENTS

| | | | |
|---|---|---|---|
| 4,297,162 A * | 10/1981 | Mundt et al. ............... 438/729 |
| 5,423,936 A * | 6/1995 | Tomita et al. ............ 156/345.34 |
| 5,561,348 A | 10/1996 | Schoenbach et al. | |
| 5,698,062 A * | 12/1997 | Sakamoto et al. ....... 156/345.44 |
| 5,710,486 A | 1/1998 | Ye et al. | |
| 5,865,896 A | 2/1999 | Nowak et al. | |
| 5,944,902 A | 8/1999 | Redeker et al. | |
| 5,952,060 A | 9/1999 | Ravi | |
| 5,990,016 A * | 11/1999 | Kim et al. ..................... 438/707 |
| 6,074,518 A * | 6/2000 | Imafuku et al. .......... 156/345.46 |
| 6,220,201 B1 | 4/2001 | Nowak et al. | |
| 6,361,644 B1 | 3/2002 | Collins | |
| 6,436,267 B1 | 8/2002 | Carl et al. | |
| 6,465,051 B1 | 10/2002 | Sahin et al. | |
| 6,524,432 B1 | 2/2003 | Collins et al. | |
| 6,572,732 B2 | 6/2003 | Collins | |
| 6,579,730 B2 | 6/2003 | Li et al. | |
| 6,586,886 B1 | 7/2003 | Katz et al. | |

(Continued)

FOREIGN PATENT DOCUMENTS

JP  58-071626 A2  4/1983

OTHER PUBLICATIONS

International Search Report and Written Opinion of the International Searching Authority dated Aug. 14, 2008 (PCT/US2008/062541).
U.S. Appl. No. 11/668,461, Pavloff, et al.

*Primary Examiner* — Sylvia R MacArthur
*Assistant Examiner* — Anna Crowell
(74) *Attorney, Agent, or Firm* — Patterson & Sheridan, LLP

(57) ABSTRACT

A substrate cleaning chamber includes a contoured ceiling electrode having an arcuate surface that faces a substrate support and has a variable cross-sectional thickness to vary the gap size between the arcuate surface and the substrate support to provide a varying plasma density across the substrate support. A dielectric ring for the cleaning chamber comprises a base, a ridge, and a radially inward ledge that covers the peripheral lip of the substrate support. A base shield comprises a circular disc having at least one perimeter wall. Cleaning and conditioning processes for the cleaning chamber are also described.

14 Claims, 4 Drawing Sheets

U.S. PATENT DOCUMENTS

| | | |
|---|---|---|
| 6,623,596 B1 | 9/2003 | Collins et al. |
| 6,652,713 B2 | 11/2003 | Brown et al. |
| 6,693,030 B1 | 2/2004 | Subrahmanyan et al. |
| 6,827,870 B1 * | 12/2004 | Gianchandani et al. ........ 216/71 |
| 6,863,020 B2 | 3/2005 | Mitrovic et al. |
| 6,929,830 B2 * | 8/2005 | Tei et al. ....................... 427/575 |
| 6,942,817 B2 * | 9/2005 | Yagi et al. ....................... 216/57 |
| 7,170,142 B2 | 1/2007 | Wojcik et al. |
| 7,196,283 B2 | 3/2007 | Buchberger et al. |
| 7,418,921 B2 * | 9/2008 | Tsuji et al. ................. 118/723 E |
| 2001/0003298 A1 * | 6/2001 | Shamouilian et al. ........ 156/345 |
| 2002/0134508 A1 * | 9/2002 | Himori et al. ............. 156/345.44 |
| 2004/0060661 A1 * | 4/2004 | Nishimoto et al. ....... 156/345.43 |
| 2004/0072426 A1 * | 4/2004 | Jung ............................. 438/689 |
| 2004/0200498 A1 | 10/2004 | Wang et al. |

\* cited by examiner

Etch Rate >350Å/min
Etch Non-Uniformity < 1.5%
Mean 355
Std. Dev. 5
- Below Calculated Mean
+ Above Calculated Mean

SUBSTRATE CLEANING CHAMBER AND CLEANING AND CONDITIONING METHODS

BACKGROUND

Embodiments of the present invention relate to a substrate cleaning chamber, chamber components, and substrate cleaning method.

In the manufacture of integrated circuits and displays, a substrate such as a semiconductor wafer or display, is placed in a process chamber and processing conditions are set to form various active and passive features on the substrate. Advanced integrated circuits and displays use multiple levels of sub-micron sized interconnects to connect the features formed on a substrate. In order to improve circuit reliability, the surface features on the substrate are cleaned prior to the deposition of overlying materials on the surfaces of the interconnect or other features. A typical pre-clean or cleaning chamber comprises an enclosure around a process zone which contains chamber components that include a substrate support to hold the substrate, a gas supply to provide a cleaning gas, a gas energizer to energize the cleaning gas to etch away the surface of the features to clean the substrate, and a gas exhaust to remove spent gas, as for example, described in U.S. Pat. No. 6,107,192, issued on Aug. 22, 2000, to Subrahmanyan et al., which is incorporated by reference herein and in its entirety.

However, conventional pre-clean chambers and processes often do not uniformly clean the surfaces of the ever smaller features being fabricated on a substrate. Failure to properly clean these features can result in void formation or increased electrical resistance between the surface features. For example, a layer of native oxides and contaminants which are left on the features can cause void formation by promoting the uneven distribution of material deposited on the substrate in a subsequent processing step, or by causing the corners of the features to grow, merge, and seal off before the feature is filled with the material being deposited therein. Pre-cleaning processes are especially desirable to uniformly etch and clean substrate surfaces for subsequent barrier layer or metal deposition processes.

It is also desirable to have pre-clean chamber that can receive ever increasing amounts of accumulated deposits without causing the chamber components to stick to each other or the accumulated deposits flaking off between cleaning cycles. During the etch cleaning process, cleaning residues often deposit on the exposed internal surfaces in the chamber. Build-up of these residues is undesirable as the accumulated deposits can flake off when thermally stressed to fall upon and contaminate the substrate and other chamber surfaces. Periodic cleaning of the residues off the chamber components reduces this problem but also requires disassembly and cleaning of the chamber components and shut-down of the chamber. Further, when metal-containing process residues accumulate on the ceiling of a chamber having an external inductor coil gas energizer to couple induction energy through the ceiling to energize the cleaning gas, the metal containing residues reduce or prevent coupling of the induction energy through the ceiling. Conventional cleaning chambers use a process kit comprising lower and upper shields, and various deposition or cover rings arranged about the substrate support to receive such process residues. Periodically, the process kit components are dismantled and removed from the chamber for cleaning. However, it is desirable to have a chamber and internal components which can receive ever larger amounts of accumulated deposits so that the chamber can be used for a larger number of process cycles before shut down.

SUMMARY

A contoured ceiling electrode is used in a cleaning chamber comprising a substrate support having a substrate receiving surface and a support electrode. The contoured ceiling electrode comprises an arcuate surface facing the substrate support. The arcuate surface has a diameter sized to extend across the substrate receiving surface of the substrate support and a cross-sectional thickness that changes across the substrate support to vary a dimension of a gap formed between the arcuate surface and the support electrode of the substrate support, thereby allowing a plasma density of a plasma formed between the arcuate surface and the substrate support to vary radially across the substrate support. The ceiling electrode can also have an annular band extending downwardly from a periphery of the arcuate surface to encircle the substrate support. A support ledge extends radially outwardly from the annular band.

A dielectric ring for the cleaning chamber comprises a base that rests on a peripheral flange of a dielectric baseplate in the chamber, to surround the substrate support. The dielectric ring also has a ridge having a height that is higher than the substrate receiving surface. A radially inward ledge covers the peripheral lip of the substrate support.

A base shield for the substrate cleaning chamber comprises a circular disc having a top surface to support the dielectric baseplate, and a plurality of lift pin holes passing through the circular disc to allow chamber lift pins to extend therethrough. The base shield also has a perimeter wall extending upward from and surrounding the circular disc, the perimeter wall being spaced apart from the peripheral flange of the dielectric baseplate.

A process for etch cleaning a layer on a substrate in a cleaning chamber comprises placing a substrate on the substrate support in the cleaning chamber, setting a gap between the support and contoured ceiling electrodes, maintaining a pressure of a cleaning gas in the chamber, and energizing the cleaning gas by applying a dual frequency electrical power to the ceiling and support electrodes, the dual frequency electrical power comprising a power ratio of a first frequency to a second frequency of at least about 1:2, the first frequency being less than about 20 KHz and the second frequency being at least about 20 MHz.

A process for etch cleaning a layer on a substrate in a cleaning chamber, comprises cleaning a first material on first batch of production substrates in the cleaning chamber to form process residues comprising the first material on the internal surfaces of the cleaning chamber. Thereafter, a conditioning layer of a second material is deposited over the process residues on the internal surfaces of the cleaning chamber by etch sputtering a conditioner substrate comprising a second material in the cleaning chamber, the second material being a different material than the first material. The first material on a second batch of production substrates provided in the cleaning chamber can then be cleaned to form further process residues comprising the first material on the conditioning layer. This process delays cleaning of the chamber.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
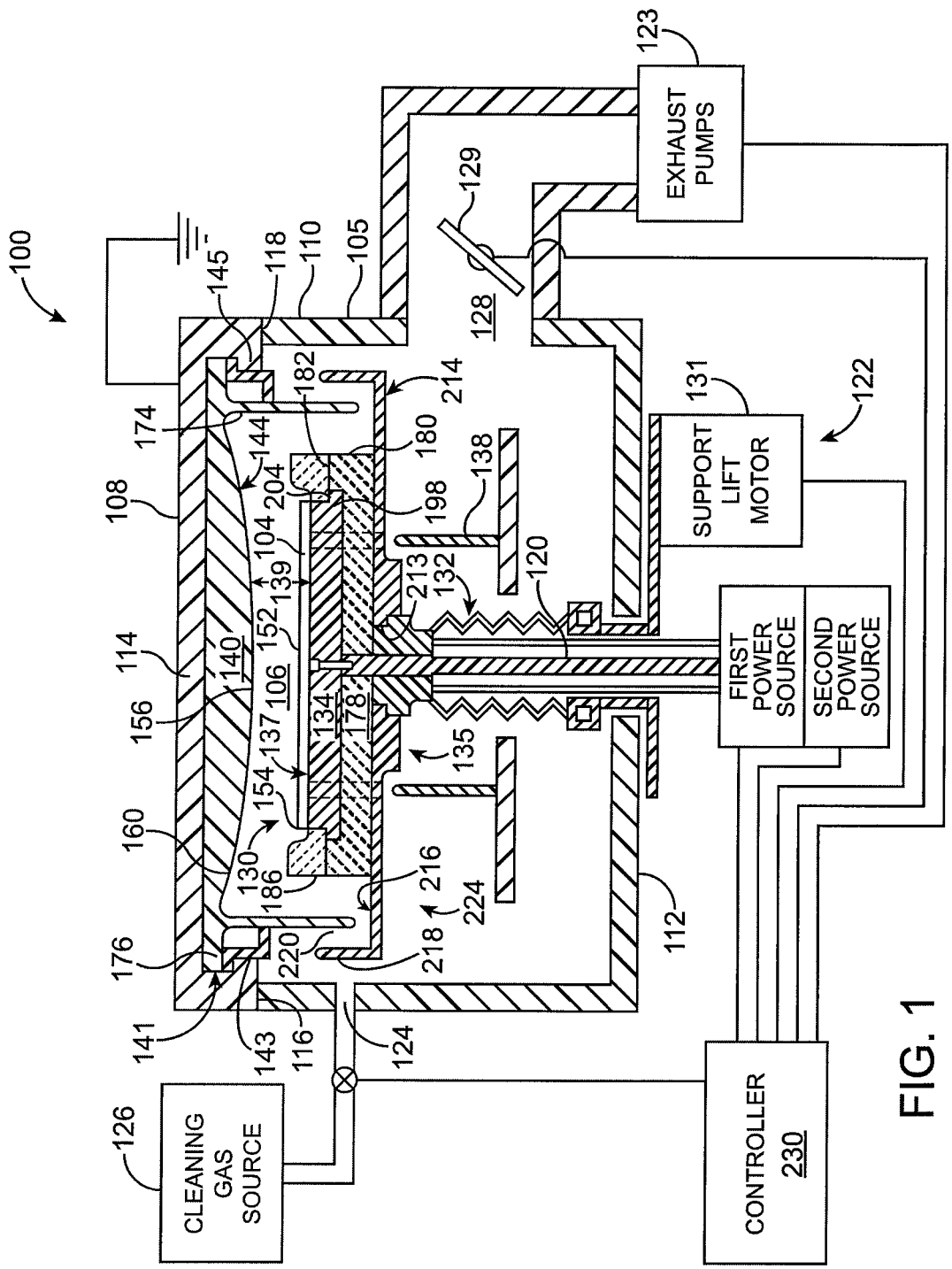
FIG. 1 is a schematic sectional side view of an embodiment of a cleaning chamber showing the contoured ceiling electrode, substrate support, dielectric ring, the electric baseplate, and lower shield.

An exemplary embodiment of a cleaning chamber 100 capable of cleaning a surface layer of a substrate 104 is illustrated in FIG. 1. Generally, the cleaning chamber 100 comprises enclosure walls 105 that enclose a process zone 106, the walls 105 include a ceiling lid 108, sidewall 110, and bottom wall 112. The enclosing walls of the chamber can be made from a metal, such as aluminum, stainless steel, copper-chromium or copper-zinc. The ceiling lid 108 comprises a plate 114 with downwardly extending side ledges 116. The side ledges 116 of the ceiling lid 108 rest on a top surface 118 of the sidewall 110. The sidewall 110 has a gas inlet 124 for introducing a cleaning gas from a cleaning gas source 126 at a flow rate monitored by a gas flow control valve 127, and an exhaust port 128 for exhausting gas from the chamber 100 past a throttle valve 129 using an exhaust pump 123. The bottom wall 112 has openings to receive electrical connectors 120 and a lifting mechanism 122. In the version shown, the cleaning chamber 100 is particularly suitable for cleaning a metal containing material, such as a metal or metal compound, off a substrate 104 by etching away a surface portion of the material. The chamber can be, for example, a REACTIVE PRE-CLEAN™ type cleaning chamber, such as the DAVINCI chamber, available from Applied Materials, Inc., of Santa Clara, Calif. The chamber 100 can be a part of a multi-chamber platform (not shown) having a cluster of interconnected chambers, such as the family of ENDURA®, PRODUCER® and CENTURA® processing platforms, all available from Applied Materials, Inc., of Santa Clara, Calif.

The chamber 100 also includes a substrate support 130 which comprises a support electrode 134. The substrate support 130 comprises a raised pedestal 135 having a surrounding peripheral lip 136 about a substrate receiving surface 137. The peripheral lip 136 extends outwardly from the bottom portion of the pedestal 135 and is at a reduced height. The substrate receiving surface 137 is planar and sized to receive a substrate 104. In the embodiment shown, the support electrode 134 and the substrate support 130 are the same structure; however, in alternative embodiments, the substrate support 130 can have a dielectric that covers or encloses (not shown) the support electrode 134. In the version shown, the substrate support 130 which also serves as the support electrode 134 comprises, or is composed of, a metal, such as for example aluminum, copper, titanium, or alloys thereof. In one version, which is desirable for high temperature pre-clean processes, the support electrode 134 is fabricated from titanium. This version provides higher operational temperatures compared to conventional support electrodes 134 which are made from aluminum. To load a substrate, the substrate support 130 is lowered by a lift motor 131 and lift bellows 132, so that the stationary lift fingers 138 extend through holes in the support 130. A substrate 104 is introduced into the chamber 100 through a substrate loading inlet (not shown) in the sidewall 116 of the chamber 100 and placed on the lift fingers 138. The substrate support 130 is then raised up to lift the substrate 104 off the lift fingers 138.

A contoured ceiling electrode 140 opposingly faces the substrate support 130 and the support electrode 134. The substrate support 130 is positioned to set a predetermined gap 139 between the support electrode 134 and the ceiling electrode 140. The contoured ceiling electrode 140 has a peripheral edge 141 that rests on a grounding ring 143 which in turn rests on a ledge 145 of the chamber lid 108. Both the contoured ceiling electrode 140 and support are made of a conducting material, such as for example, aluminum, and are bolted to the chamber body which is also made of a metal conductor such as aluminum. The contoured ceiling electrode 140 and grounding ring 143 are electrically interconnected and can be maintained at a floating potential or grounded. The grounding ring 143 and peripheral edge 141 of the contoured ceiling electrode 140 are shaped to impede the penetration of low-angle sputtered plasma species and resultant process deposits past their surfaces.

Conventional cleaning chambers used an inductor coil wrapped around a dome shaped dielectric ceiling to inductively couple energy to the cleaning gas in the chamber to form a plasma which cleans the substrate 104. However, when cleaning a metal layer on the substrate 104, process residues containing metal species deposit on the internal surfaces of the chamber ceiling 114, and this metal-containing layer disturbs the inductive coupling of energy through the ceiling 114.

In the present version of the cleaning chamber, the conventionally used inductor coil is replaced by a contoured ceiling electrode 140 which has a contoured profile and which couples with the support electrode 134 to energize a plasma from the cleaning gas provided in the chamber 100. The ceiling electrode 140 can receive metal-containing deposits without affecting the performance of the electrode 140 because the electrode 140 itself is made of a conductor, such as a metal. This improves performance of the cleaning chamber 100 in the cleaning of metal-containing materials on the substrate 104.

In one version, the contoured ceiling electrode 140 comprises an arcuate surface 144 that faces the substrate support 130, a version of which is illustrated in FIGS. 1 to 4. The arcuate surface 144 includes a single or multi-radius curved surface which has a diameter sized sufficiently large to extend across the substrate receiving surface of the substrate support 130. The shape of the arcuate surface 144 is selected to control a plasma density or flux of a plasma formed between the arcuate surface 144 and the substrate support 130 or support electrode 134. As one example, the arcuate surface 144 can extend across substantially the entire substrate receiving surface of the substrate support 130 or support electrode 134, for example, at least about 70%, or even at least about 90%, of the substrate receiving surface area of the substrate support 130.

The arcuate surface 144 also has a variable cross-sectional thickness or profile that is shaped to vary a dimension or size of the gap 139 between the ceiling electrode 140 and the support electrode 134 of the substrate support 130. This varies the gap distance between the arcuate surface 144 and the corresponding area of the substrate support 104 and/or support electrode 134. The varying gap distance provides a plasma density that varies radially across an entire surface of a substrate 104 held on the substrate receiving surface 137 of the substrate support 130. Conventional ceiling electrodes have a flat surface to provide a uniform electric flux across the gap between the substrate receiving surface and the ceiling electrode. In contrast, the contoured ceiling electrode 140 has a profile 146 that is capable of generating a non-uniform or variable electric flux across the process zone 106 of the cleaning chamber 100 which is counterintuitive to conventional flat electrode designs. This electrode shape allows a plasma density of a plasma formed between the arcuate surface 144 and the substrate support 130 to vary radially across the substrate support 130.

The shape of an arcuate profile 146 of the arcuate surface 144 of the contoured ceiling electrode 140 is experimentally determined based on test results obtained for test substrates 104 that are etched using a flat ceiling electrode (not shown). An etching parameter, such as etch depth or etch rate, is measured at a number of discrete points across the surface of the test substrate 104 to obtain a plurality of measurement points that give an etch profile 148 across the substrate 104. The arcuate profile 146 of the contoured ceiling electrode 140 is then shaped to compensate for the etch profile obtained with the flat electrode. For example, the arcuate profile 146 of the contoured ceiling electrode 140 can be shaped to provide a weaker electric field and hence higher plasma density at those regions of the substrate 104 measured to have a smaller etch depth or lower etch rate with a flat electrode, and conversely, shaped to provide a stronger electric field and hence lower plasma density at those regions of the substrate 104 that were found to be etched to a greater depth or with a higher etch rate with the flat electrode. Thus, the arcuate profile 146 is shaped in relation to the etch depth profile 148 of the substrate 104 so that the gap 139 between the support electrode 134 and contoured ceiling electrode 140 varies in relationship to the etch profile 148 of the test substrate 104 obtained using a flat ceiling electrode. At positions where the etch depth on the substrate 104 is greatest, the arcuate profile 146 of the contoured ceiling electrode 140 is recessed the most to reduce the electric field and increase the corresponding plasma density at that region, or vice versa.

Figure 3:
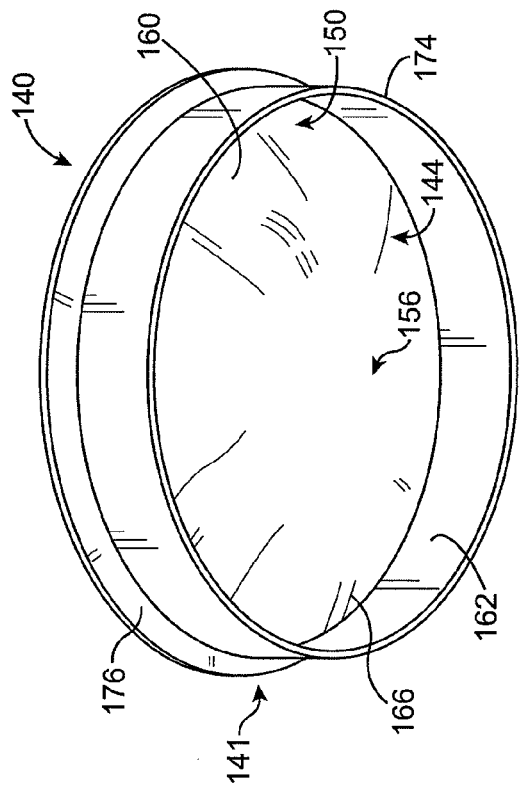
FIG. 3 is a perspective view of an embodiment of a contoured ceiling electrode having an arcuate surface comprising a convex bulge, a peripheral groove, and a peripheral wall.
Figure 2:
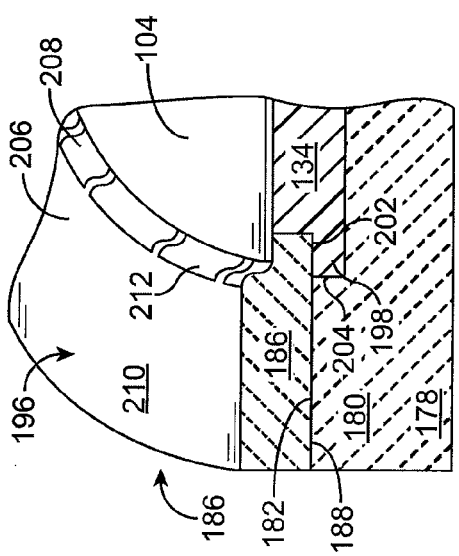
FIG. 2 is a graph of the etch profile obtained on a test substrate which was etch cleaned using a flat ceiling electrode, and a corresponding mapping of the arcuate profile selected for a contoured ceiling electrode that compensates for this etch profile.

A graph of the etch profile 148 obtained on a test substrate 104 which was etch cleaned using a flat surfaced ceiling electrode, and a corresponding mapping of the arcuate profile 146 selected for a contoured ceiling electrode 140 that can compensate for this etch profile 148, is shown in FIGS. 2 and 3. In the embodiment graphed, the arcuate profile 146 comprises a convex bulge 150 that forms a smoothly curving surface which extends across at least about 70% of the area of the contoured ceiling electrode 140 that is exposed in the chamber 100 and which faces the substrate support 130. FIG. 1 shows the relationship of the contoured ceiling electrode to the support electrode 134 in the substrate support 130. The substrate support 130 comprises central and peripheral regions 152, 154, and the convex bulge 150 is shaped to increase a plasma density at the peripheral region 154 relative to the central region 152 during processing of the substrate 104 in the chamber 100. This is accomplished by reducing the gap distance between the contoured ceiling electrode 140 and the substrate receiving surface 137 at the central region 152 to a first smaller distance decrease a plasma density therein, and increase the gap distance between the contoured ceiling electrode 140 and the substrate receiving surface 137 at the peripheral region 154 to a second and higher gap distance to increase a plasma density therein. The convex bulge 150 sets the gap between the support electrode 134 and contoured ceiling electrode 140 to be narrower at the central region 152 than the peripheral region 154 of the substrate support 130. In one version, the closest distance of the gap between the support electrode 134 and the apex 156 of the convex bulge 150 of the contoured ceiling electrode 140 is at least about 3 cm. Thus, the contoured ceiling electrode 140 compensates for the etch rates that were measured across the substrate 104 using a flat ceiling electrode, to result in substantially uniform etch cleaning rates and etch uniformity across the substrate 104.

The contoured ceiling electrode 140 can also have a convex bulge 150 that has other shapes. For example, the convex bulge 150 can have a multi-radius arc 160 that transitions continuously across different radiuses of curvature, and is surrounded by a recessed peripheral groove 162 that is concave. In yet another version, the central portion 164 of the convex bulge 150 can be slightly flattened. The convex bulge 150 transitions from the peripheral concave groove 162 to top region 172 via an annular rim 166 that is curved, and which is approximately inclined relative to the plane of the flattened central portion.

Figure 4:
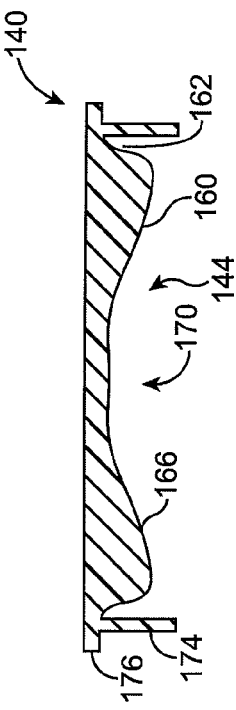
FIG. 4 is a sectional side view of a contoured ceiling electrode having an arcuate surface that is a concave depression.

In another prospective version, as shown in FIG. 4, the arcuate surface 144 of the contoured ceiling electrode 140 is shaped to have a concave depression 170 that performs the opposite function to that obtained from the contoured ceiling electrode shaped as shown in FIGS. 2 and 3. In this version, the concave depression 170 is shaped to increase a plasma density at the central region 152 relative to the peripheral region 154 during processing of the substrate 104 in the chamber 100. This is accomplished by increasing the gap distance at the central region 152 to increase plasma density at those regions, and reducing the gap distance between the contoured ceiling electrode 140 and the support electrode 134 at the peripheral region 154 to decrease a plasma density therein. The arcuate surface 144 can also be a multi-radius arc 160 or have a flattened plateau on its the top portion. This version of the contoured ceiling electrode 140 also compensates for etch rates obtained across the substrate 104 using a flat ceiling electrode when higher etch rates are obtained at the central region 152 relative to the peripheral region 154 of a test substrate 104 processed with a flat electrode, to provide an etch cleaning process in which the substrate is uniformly etch cleaned across its surface.

The contoured ceiling electrode 140 also has an annular band 174 that extends downwardly from a periphery of the convex bulge 150 to encircle the substrate receiving surface 137 of the substrate support 130, as shown in FIGS. 1 and 3. The annular band 174 encircles the process zone 106 that occurs between the arcuate surface 144 of the contoured ceiling electrode 140 and the substrate support 130. The annular band 174 extends downward from the ceiling lid 108 sufficiently to encircle the outer periphery of the substrate support 130 and shadow the sidewalls 110 of the chamber 100 during the process cycle. The annular band 174 serves as an upper shield to reduce or prevent the deposition of process residues originating from the surface of the substrate 104 that would otherwise fall on the side walls 110 of the chamber 100 and other internal surfaces of the chamber 100. The annular band 174 also serves to contain the cleaning plasma on the surface of the substrate 104. This reduces erosion of internal chamber surfaces by the cleaning plasma. The peripheral edge 141 of the contoured ceiling electrode comprises a support ledge 176 that extends radially outwardly from around the annular band 174, and serves to support the contoured ceiling electrode 140. In this version, the contoured ceiling electrode 140 is composed of aluminum, but it can also be made of other electrical conductors, including metals such as stainless steel.

Figure 5:
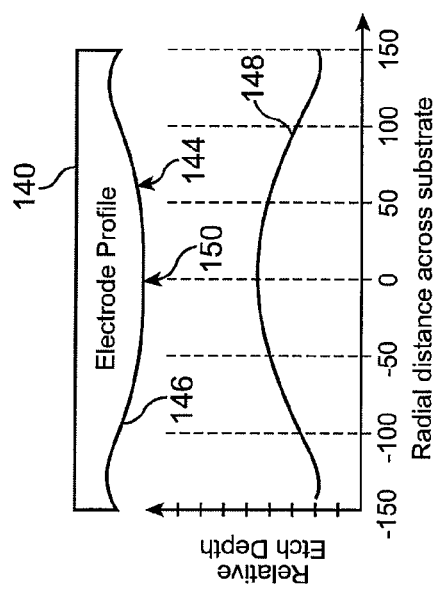
FIG. 5 is a partial sectional view of an embodiment of a cover ring resting on a dielectric base plate and substrate support, and showing a substrate positioned on the substrate support.

A dielectric baseplate 178 is located below the support electrode 134 of the substrate support 130 as shown in FIGS. 1 and 5. The dielectric baseplate 178 serves to electrically isolate the support electrode 134 from the surrounding chamber components. The dielectric baseplate 178 receives the substrate support 130 having the support electrode 134 on the top surface. The dielectric baseplate 178 has a peripheral flange 180 that surrounds the top surface of the support 130 to insulate a peripheral edge 198 of the support electrode 134. The peripheral flange 180 has an annular top surface 182 that encircles a peripheral lip 204 of the support electrode 134.

Referring to FIG. 5, a dielectric ring 186 comprises a base 188 that rests on the annular top surface 182 of the peripheral flange 180 to surround the support electrode 134 of the substrate support 130. The dielectric ring 186 also has a ridge 196 having a height that is higher than the substrate receiving surface 137. The ridge 196 of the dielectric ring 186 serves to contain and focus the cleaning plasma on the surface of the substrate 104. The ridge 196 also operates in synergy with the contoured profile 146 of the contoured ceiling electrode 140 to control the plasma density and the energy of the plasma species at the peripheral edge of the substrate 104. For example, the dielectric ring 186 can reduce the plasma ion flux hitting the substrate 104 at the peripheral region of the substrate 104, thereby reducing etching rates in the peripheral region as compared to a central region of the substrate 104. This provides more uniform cleaning across the substrate 104 by controlling etching rates across the substrate 104. The dielectric ring 186 has a radially inward ledge 202 that covers the peripheral lip 204 of the substrate support 130 and also serves to enclose and protect the peripheral edge 198 of the support electrode 134. Further, the radially inward ledge 202 also provides a step having a reduced height immediately surrounding the perimeter of the substrate 104 being processed on the substrate support 130.

The ridge 196 and a radially inward ledge 202 of the dielectric ring 186 are joined by an inner face 208 which can be substantially straight or sloped. In one version, the inner face 208 is substantially straight and perpendicular to the plane of the substrate surface. In another version, the sloped inner face 208 is inclined relative to the top surface plane of the ridge 196 by an angle β of at least about 60°, for example, from about 82° to about 98°. The sloped inner face 208 provides a gradual transition region for the plasma formed over the substrate 104. The sloped inner face 208 also comprises rounded edges 212 to reduce the stresses that would be otherwise be created on a coating covering a sharp edge or corner, these stresses being responsible for causing early flaking off of residues deposited on these regions. Thus the rounded edges 212 allow an increased thickness of process residues to be deposited on the dielectric ring 186. The rounded edges 212 also further reduce the erosive effect of the cleaning plasma on the edges of the dielectric ring 186.

Figure 6A:
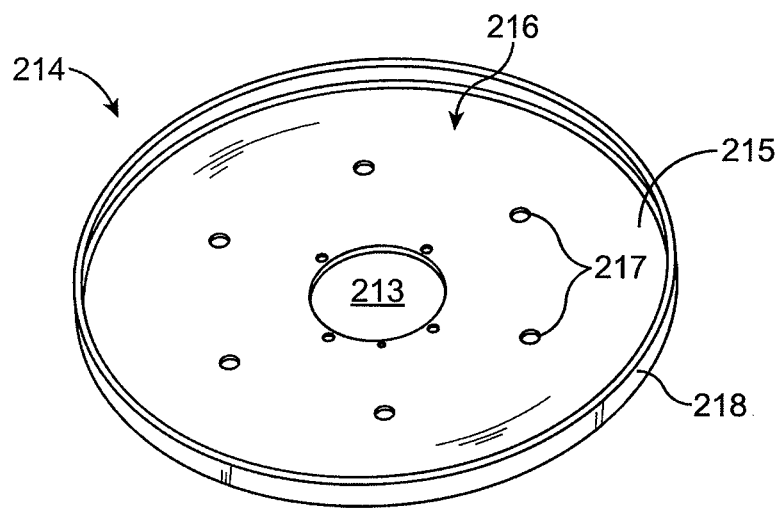
FIG. 6A is a perspective view of an embodiment of a base shield comprising a circular disc with a surrounding perimeter wall.

A base shield 214 (also known as a lower shield) is used to support the dielectric baseplate 178 as shown in FIG. 1. Referring to FIG. 6A, the base shield 214 comprises a circular disc 215 having a top surface 216 with a plurality of lift pin holes 217 for a plurality of lift pins 138 to extend therethrough. The top surface 216 of the circular disc 215 is used to support the dielectric baseplate 178. The top surface 216 can also have a central hole 213 to allow the electrical connectors 120 and other structures to extend therethrough. The base shield 214 also has a perimeter wall 218 extending upwardly from and surrounding the circular disc 215. The perimeter wall 218 is spaced apart from the peripheral flange 180 of the dielectric baseplate 178 as shown in FIG. 1. For example, the perimeter wall 218 can be spaced apart from the peripheral flange 180 of the dielectric baseplate 178 by a spacing distance of at least about 1 cm. The perimeter wall 218 also extends substantially vertically from the top surface 216 of the circular disc 215, for example, to a height of at least about 5 mm. The perimeter wall 218 is also spaced apart from, and parallel to, the band shield 174 of the contoured ceiling electrode 140. For example, the perimeter wall 218 can be spaced apart from the band shield 174 by a spacing distance of at least about 1 cm. The perimeter wall 218 forms a convoluted passageway with the ban shield 174 to form a narrow gap 220 therebetween that serves as a labyrinth to impede the passage of plasma species therethrough. The constricted flow path of the narrow gap 220 restricts the build-up of low-energy plasma deposits on the outer radially surfaces of the chamber such as the sidewalls 110. Also the exposed surfaces of the perimeter wall 218 of the base shield 214 and the band shield 174 act as deposition surfaces to receive residue deposits before they access the chamber sidewalls 110. In this manner, the base shield 214 further protects the chamber sidewalls 110 from the process residues. The base shield 214 can be electrically grounded or maintained at a floating or other electrical potential. In one version, the base shield 214 is composed of an electrical conductor, such as a metal, for example, aluminum, or other metals.

Figure 6B:
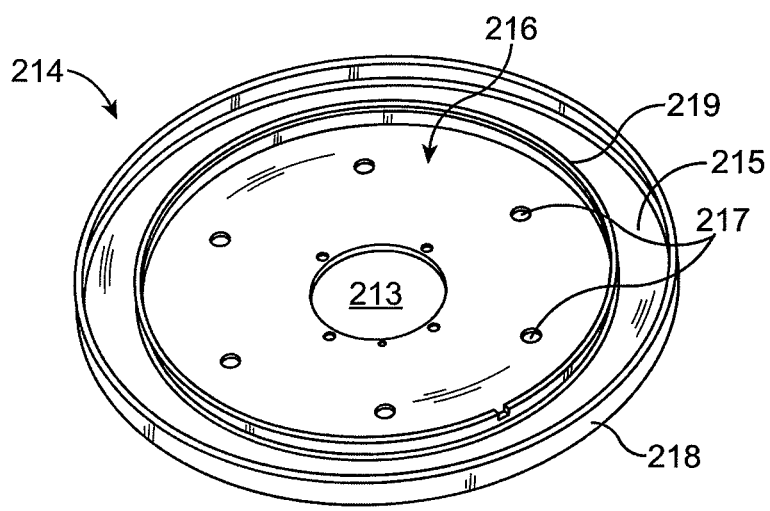
FIG. 6B is a perspective view of another embodiment of a base shield comprising a surrounding perimeter wall and an inner wall that are concentric to one another.

Another version of the base shield 214, as shown in FIG. 6B, includes an inner wall 219 between the perimeter wall 218 of the base shield 214 and the peripheral flange 180 of the dielectric baseplate 178. In one version, the inner wall 219 also extends vertically upward from the top surface 216 of the circular disc 215. In one version, the inner wall 219 is spaced apart from the perimeter wall 218 by a spacing distance of at least about 1 cm, and the inner wall 219 has a height of at least about 5 mm. The inner wall 219, like the rest of the base shield 214, can be composed of an electrical conductor. The inner wall 219 can serve, for example, to raise the ground plane by providing an electrically conducting pathway closer to the contoured ceiling electrode 140. This changes the electric flux or plasma density, and consequently the etch rate, at the localized region about the inner wall 219 and the edge of the substrate 104 to achieve a more uniform etch across the entire substrate 104. Thus the inner wall 219 is adapted to serve as another form of plasma control in this version of the base shield 214 for controlling the plasma distribution across the substrate 104.

In an exemplary version of a cleaning process, a substrate 104 is placed on the substrate support 130 in the cleaning chamber 100, and the substrate support 130 is moved to set a gap 139 between the support electrode 134 and the contoured ceiling electrode 140. Cleaning gas is introduced into the chamber 100 through the gas inlet 124 which provides the cleaning gas from a gas source 126, which can be a single gas supply or a number of gas supplies that provide different gasses which are mixed together in a desirable flow ratio. The flow rate of the cleaning gas is controlled thorough a plurality of gas flow control valves 128, such as mass flow controllers, to pass a set flow rate of cleaning gas into the chamber. The gas pressure is set by controlling the flow of gas to exhaust pumps 123 using the throttle valve 129. Typically, the pressure of the cleaning gas in the chamber 100 is set to sub-atmospheric levels, such as a vacuum environment, for example, gas pressures of from about 1 mTorr to about 1 Torr. The cleaning gas can include a non-reactive gas which is capable of being energized to form plasma species and energetically impinging upon and sputtering material from the substrate 104. The cleaning gas may also comprise reactive gases, such as oxygen-containing gases or halogen-containing gases, which are capable of reacting with native oxides, polymeric residues, or other materials on the surface of the substrate 104 to form volatile compounds which are removed from the chamber 100 by the exhaust system.

One process for removing native oxides and other contaminants from polysilicon, copper and metal surfaces, uses a cleaning process step in which the substrate surface is exposed to an energized cleaning gas, and which can be optionally followed by a reducing process step in which the substrate surface is exposed to an energized reducing gas. The cleaning process step uses a cleaning gas such as oxygen, a mixture of $CF_4/O_2$, or a mixture gases such as $NF_3$ and He. Residual native oxides can also be reduced in a reducing process step by treatment with a plasma which has hydrogen radicals. During the cleaning process, removal of the native oxide and other surface contaminants is monitored by taking reflectivity measurements of the exposed layer on the substrate 104. The surface reflectivity can be used to measure the presence of native oxides or other contaminants on the substrate because these materials change the reflectivity of the substrate surface. Reflectivity is typically measured in cleaning processes using optical devices.

The chamber 100 is controlled by a controller 230 that comprises program code having instruction sets to operate components of the chamber 100 to process substrates 104 in the chamber 100. For example, the controller 230 can comprise program code that includes substrate positioning instruction sets to operate the lift motor 131 of the substrate support 130 and the substrate transfer and robot mechanism; gas flow control instruction sets to operate gas flow control valves 127 to set a flow of cleaning gas to the chamber 100; gas pressure control instruction sets to operate the exhaust throttle valve 129 to maintain a pressure in the chamber 100; gas energizer control instruction sets to operate the gas energizer comprising the support electrode 134 and opposing contoured ceiling electrode 140 to set a gas energizing power level; temperature control instruction sets to control a temperature control system in the substrate support 130 or a chamber wall 105 to set temperatures of various components in the chamber 100; and process monitoring instruction sets to monitor the process in the chamber 100.

In one cleaning process, the cleaning gas is energized by a dual frequency electrical power which applies a first electrical voltage comprising a first frequency and a second electrical voltage comprising a second frequency, to the support electrode 134 and contoured ceiling electrode 140. The first frequency is lower than the second frequency, for example, the first frequency can be lower than the second frequency by at least about 10 KHz. In one version, the first frequency is less than about 20 KHz and the second frequency is at least about 20 MHz. For example, the first frequency can be 13.5 KHz, and a second frequency can be 60 MHz.

The power ratio of the first frequency to the second frequency also affects the cleaning process because it is believed that the first frequency provides increased acceleration of the plasma species and the second frequency provides additional ionization and dissociation in the plasma. Thus when the voltage at the first frequency is supplied at a higher electrical power level than the voltage at the second frequency, the ratio of the amount of plasma species to the kinetic energy of the plasma species can be controlled. Plasma species having a higher kinetic energy produce increased or deeper penetrating sputtering of the substrate while an increased number of plasma species produces a greater more uniform distribution or plasma flux across the surface. For example, an embodiment of the cleaning process applies voltage at a first frequency of 13.5 MHz at a power level of from about 200 to about 200 Watts; and voltage at a second frequency of 60 MHz at a power level of from about 800 to about 1300 Watts. In this version, the 60 Mhz power contributes to increased plasma density by creating more ions. In contrast, the 13.56 Mhz power contributes to ion energy by accelerating ions created by the 60 Mhz power to accelerate these ions across the plasma sheath. Too little 60 Mhz power results in insufficient plasma species available, and too little 13.56 Mhz power causes the plasma ions to lack sufficient levels of kinetic energy to etch the substrate surface. Thus, in one cleaning process, the power ratio of the first frequency to the second frequency is set to be at least about 1:2, or even at least about 1:3.

Figure 7:
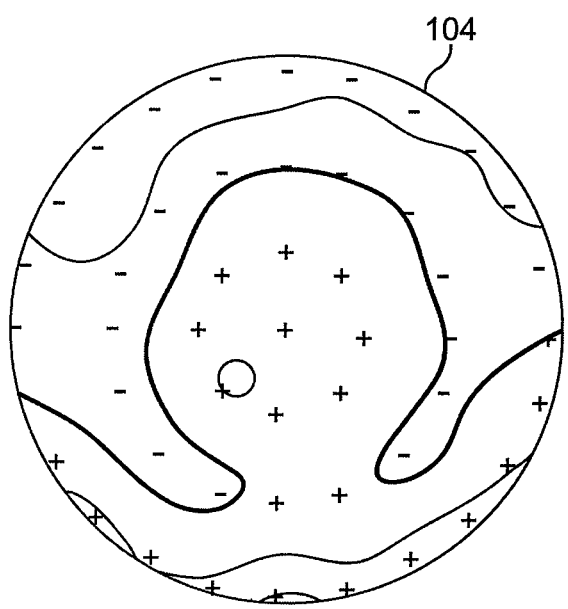
FIG. 7 is a contour plot of the uniform cleaning rates obtained across the surface of a substrate processed in the cleaning chamber.

FIG. 7 shows a contour plot of the uniform cleaning rates obtained across the surface of a substrate processed in the cleaning chamber 100 using the cleaning process described herein. The substrate 104 was a 300 m silicon wafer coated with a thermal silicon dioxide layer. The substrate 104 was cleaned using the following process conditions: 300 W of 13.56 Mhz and 1000 W of 60 Mhz power; chamber pressure of 4.5 mT; argon flow. The chamber 100 used a contoured ceiling electrode 140 having an arcuate surface 144 with a convex bulge 150 as shown in FIG. 3. In the cleaning process, the etch cleaning rate was measured across the substrate 104, as shown in the contour map of FIG. 7. The average etch rate was found to be about 350 Å/minute, and the points shown on the contour map correspond to the etch rate values that exceed or fall below the average etch cleaning rate. The contoured ceiling electrode 140 and dual frequency cleaning process provided a high etch cleaning uniformity with the etch cleaning rates varying less than 1.5% across the surface of the substrate.

In yet another aspect, the process for etch cleaning a layer on the substrate 104 in the cleaning chamber 100 is further enhanced by performing a conditioning process which coats a metal layer on the internal surfaces of the chamber 100 in between cleaning steps. In the cleaning process step, a first batch of production substrates 104 is cleaned in the cleaning chamber 100 to clean and remove contaminants and native oxide off a first material on the substrates 104. This cleaning step causes process residues comprising the first material to deposit on the internal surfaces of the cleaning chamber 100. After processing of a number of substrates 104, the process residues and deposits on the internal surfaces of the chamber 100 accumulate to a sufficiently high thickness that they risk flaking-off in subsequent process cycles due to a build-up of film stress. At this time, a conditioner substrate is transferred into the cleaning chamber 100. The conditioner substrate is etch sputtered in the cleaning chamber 100 by introducing a sputtering gas in the cleaning chamber 100 and energizing the sputtering gas by capacitively coupling electrical power to the sputtering gas. The conditioner substrate comprises a second material that is a different material than the first material previously cleaned off the production substrates 104. The sputtering process sputters material from the conditioner substrate to coat the cleaning chamber 100 with the sputtered "paste" material that serves as a conditioning layer over the process residues. The freshly coated internal surfaces of the chamber 100 can now receive additional process residue deposits without flaking off of these process residue deposits.

After the chamber conditioning step, a second batch of production substrates is cleaned in the cleaning chamber 100 to clean the first material on the substrates 104 to accumulate additional process residues on the conditioning layer which has been formed over the previously deposited process residues on the internal surfaces of the cleaning chamber 100. This process allows additional process cycles to be conducted before the process kit components of the chamber 100 have to be dismantled and cleaned, thereby increasing runtime of the chamber 100. The conditioning process allows processing of sequential batches of substrates many times before requiring removal of process kit components in the cleaning chamber for cleaning. For example, a number of batches of substrates can be cleaned to accumulate process residues on the chamber surfaces, and then conditioning layer can be deposited on the accumulated process residues, and this process can be repeated at least 2 or more times, before removing the process kit in the cleaning chamber for cleaning of process residues accumulated thereon.

In one embodiment, the production substrates comprise a first material comprising a first metal-containing material, such as a silicon containing material, for example, silicon nitride (SiN), or other materials, such as polyimide. When etch cleaned, these substrates cause the deposition of process residues composed of silicon nitride or polyimide on the internal chamber surfaces. A suitable conditioning material comprises a second material which can be a second-metal containing material, such as for example, aluminum or titanium. This second material is sputtered in the chamber to deposit the conditioning layer on the accumulated process residues. In one version, the periodic conditioning process is performed after accumulation of process residues in a thickness of at least about 1 micron; however, this depends on the type and sticking quality of the residues and the underlying chamber surface composition. In one version, the conditioning process is performed to deposit a conditioning layer in a thickness of at least about 500 angstroms on the internal surfaces of the process chamber.

In one exemplary version of a conditioning process, a sputtering gas comprising argon is introduced into the cleaning chamber, and the gas is energized by capacitively coupling RF energy at a frequency of 13.56 MHz at a power level of 300 watts; and RF energy at a frequency of 60 Mhz power at a power level of 1000 Watts, for about 2 minutes. The source of the conditioning material can be the process kit and other components in the chamber itself; a substrate with a coating of the second material, such as a silicon wafer with coating of aluminum; or even a sacrificial pedestal of aluminum that can be sputtered in the chamber. This sputtering process deposits a conditioning layer having a thickness of from about 0.08 to about 0.12 microns over the accumulated process residues which have been formed on the internal chamber surfaces. The conditioning process can be repeated after cleaning of from about 50 to about 100 substrates. Advantageously, the conditioning process can allow processing of a larger number of substrates, for example, from about 3500 to about 4500 substrates, without requiring an intervening step of shutting down the chamber to remove process residues off the chamber components.

Embodiments of the process kit, cleaning chamber 100, and cleaning and conditioning processes described herein provide significant advantages. The contoured ceiling electrode 140, dielectric ring 186, substrate support 130, base shield 214, and other process kit components of the cleaning chamber 100 provide more uniform cleaning of the surface contaminants and native oxide layers on the substrate 104, while also allowing for a larger number of substrate processing cycles between clean cycles. In addition, the dual frequency, capacitively coupled, cleaning process provides better cleaning control over both the number of plasma species or plasma density across the substrate surface as well as the kinetic energy of the plasma species. Furthermore, the in-situ metal sputtering process substantially increases the number of process cycles between chamber clean cycles. Thus, the present process and apparatus provides significantly better cleaning while also providing a substantial reduction in the down time of the cleaning chamber 100 which is required for the opening and removing chamber components for cleaning the same.

The present invention has been described with reference to certain preferred versions thereof; however, other versions are possible. For example, the contoured ceiling electrode, dielectric ring, support, and lower shield, can be used in other types of applications, as would be apparent to one of ordinary skill, for example, etching chambers, CVD chambers, and PVD chambers. Therefore, the spirit and scope of the appended claims should not be limited to the description of the preferred versions contained herein.

What is claimed is:

1. A ceiling electrode for a cleaning chamber which comprises a substrate support having a substrate receiving surface and a support electrode, the ceiling electrode comprising:
    a grounding ring; and
    a contoured ceiling electrode consisting of metal, the contoured ceiling electrode comprising:
        (a) an arcuate surface facing the substrate support, the arcuate surface having a diameter sized to extend across the substrate receiving surface of the substrate support and a cross-sectional thickness that changes across the substrate support to vary a dimension of a gap formed between the arcuate surface and the support electrode of the substrate support, thereby allowing a plasma density of a plasma formed between the arcuate surface and the substrate support to vary radially across the substrate support;
        (b) an annular band extending downwardly from a periphery of the arcuate surface through the grounding ring to encircle the substrate support;
        (c) a peripheral edge extending radially outwardly from the annular band, wherein said peripheral edge rests on the grounding ring; and wherein the annular band is spaced apart from a sidewall of the cleaning chamber by the grounding ring.

2. A ceiling electrode according to claim 1 wherein the arcuate surface extends across at least about 70% of the substrate receiving surface area of the substrate support.

3. A ceiling electrode according to claim 1 wherein the substrate support comprises central and peripheral regions, and wherein the arcuate surface comprises an arcuate profile that is shaped as a convex bulge to increase a plasma density at the peripheral region relative to the central region of the substrate support.

4. A ceiling electrode according to claim 1 wherein the arcuate surface is composed of an electrical conductor.

5. A cleaning chamber comprising the contoured ceiling electrode of claim 1, and further comprising:
(1) the substrate support;
(2) an electrode power supply to supply a voltage bias across the support and contoured ceiling electrodes;
(3) a gas distributor for introducing a cleaning gas into the chamber; and
(4) a gas exhaust.

6. A cleaning chamber for etching a substrate in a plasma, the chamber comprising:
(a) a substrate support having a substrate receiving surface and comprising a support electrode;
(b) a contoured ceiling electrode having a metal arcuate surface that opposingly faces the substrate receiving surface of the substrate support, the metal arcuate surface having a diameter sized to extend across the substrate receiving surface area of the substrate support and a cross-sectional thickness that changes across the substrate support to vary a dimension of a gap formed between the metal arcuate surface and the support electrode of the substrate support, thereby providing a plasma density that varies radially across the substrate receiving surface;
(c) an electrode power supply to supply a voltage bias across the support and contoured ceiling electrode;
(d) a gas distributor for introducing a cleaning gas into the chamber;
(e) a gas exhaust;
(f) a grounding ring;
(g) a metal annular band that contacts the grounding ring, wherein the metal annular band extends downwardly from a periphery of the metal arcuate surface through the grounding ring to encircle the substrate receiving surface of the substrate support;
(h) a peripheral edge extending radially outwardly from the annular band, wherein said peripheral edge rests on the grounding ring; and wherein the annular band is spaced apart from a sidewall of the cleaning chamber by the grounding ring.

7. A chamber according to claim 6 wherein the metal arcuate surface of the contoured ceiling electrode comprises a convex bulge or concave depression.

8. A chamber according to claim 6 wherein the substrate receiving surface comprises central and peripheral regions, and wherein the metal arcuate surface comprises a convex bulge that is shaped to increase a plasma density at the peripheral region relative to the central region of the substrate support.

9. A chamber according to claim 6 wherein the metal arcuate surface and the metal annular band both consist of aluminum.

10. A chamber according to claim 9 comprising an electrical connector rod connected to the support electrode, and wherein the electrical connector rod comprises copper.

11. The cleaning chamber of claim 5, wherein the gas distributor is positioned in a sidewall of the cleaning chamber.

12. The ceiling electrode of claim 1, wherein the grounding ring is electrically interconnected with the contoured ceiling electrode and the contoured ceiling electrode and grounding ring can be maintained at a floating potential or grounded.

13. The cleaning chamber of claim 6, wherein the gas distributor is positioned in a sidewall of the cleaning chamber.

14. The ceiling electrode of claim 6, wherein the grounding ring is electrically interconnected with the contoured ceiling electrode and the contoured ceiling electrode and grounding ring can be maintained at a floating potential or grounded.

* * * * *